United States Patent
Wortberg et al.

(10) Patent No.: US 10,436,830 B2
(45) Date of Patent: Oct. 8, 2019

(54) DEVICE AND METHOD FOR RECOGNIZING DISRUPTIONS IN AN ON-BOARD POWER SUPPLY

(71) Applicants: Lisa Draexlmaier GmbH, Visbiburg (DE); Volkswagen Aktiengesellschaft, Wolfsburg (DE)

(72) Inventors: Michael Wortberg, Dorfen (DE); Florian Rudolph, Wolfsburg (DE)

(73) Assignees: Lisa Draexlmaier GmbH, Vilsbiburg (DE); Volkswagen Aktiengesellschaft Wolfsburg (DE)

( * ) Notice: Subject to any disclaimer, the term of this patent is extended or adjusted under 35 U.S.C. 154(b) by 0 days.

(21) Appl. No.: 15/163,837

(22) Filed: May 25, 2016

(65) Prior Publication Data

US 2016/0349301 A1    Dec. 1, 2016

(30) Foreign Application Priority Data

May 26, 2015    (DE) .................. 10 2015 209 588

(51) Int. Cl.
G01R 31/00        (2006.01)
G01R 31/02        (2006.01)
(Continued)

(52) U.S. Cl.
CPC ......... G01R 31/005 (2013.01); G01R 31/025 (2013.01); G01R 31/40 (2013.01);
(Continued)

(58) Field of Classification Search
CPC .... G01R 31/005; G01R 31/40; G01R 31/025; G01R 31/1272; H02H 1/0015; B60R 16/0232
See application file for complete search history.

(56) References Cited

U.S. PATENT DOCUMENTS

2004/0150410 A1*  8/2004  Schoepf ............... H02H 1/0015
                                                                 324/536
2006/0109009 A1*  5/2006  Banke .................. H02H 1/0015
                                                                 324/536
(Continued)

FOREIGN PATENT DOCUMENTS

CN    104253585 A    12/2014
CN    104380554 A     2/2015
(Continued)

OTHER PUBLICATIONS

Office Action from Chinese Application No. 201610363590.3 dated Sep. 4, 2018 (9 pages in English).

*Primary Examiner* — Akm Zakaria
(74) *Attorney, Agent, or Firm* — Finnegan, Henderson, Farabow Garrett & Dunner LLP

(57) ABSTRACT

The present disclosure relates to a device for recognizing disruptions in an on-board power supply. The device comprises a reception unit adapted to receive a first and a second temporal sequence of measurement values, the measurement values of the first sequence being measured at a first measuring point of the on-board power supply and the measurement values of the second sequence being measured at a second measuring point of the on-board power supply differing from the first measuring point, and the measurement values representing current or voltage values, and an evaluation unit adapted to recognize the occurrence of a disruption based on a comparison of the first dispersion of the measurement values of the first sequence and a second dispersion of the measurement values of the second sequence.

12 Claims, 13 Drawing Sheets

(51) Int. Cl.
   *G01R 31/40*   (2014.01)
   *H02H 1/00*    (2006.01)
   *B60R 16/023*  (2006.01)
   *G01R 31/12*   (2006.01)

(52) U.S. Cl.
   CPC ....... *H02H 1/0015* (2013.01); *B60R 16/0232* (2013.01); *G01R 31/1272* (2013.01)

(56) References Cited

U.S. PATENT DOCUMENTS

| | | | | |
|---|---|---|---|---|
| 2013/0057293 | A1* | 3/2013 | Miyamoto | G01R 31/362 324/433 |
| 2015/0029014 | A1* | 1/2015 | Bande Martinez | G08B 21/06 340/439 |
| 2015/0346286 | A1* | 12/2015 | Janssen | H02J 3/00 702/58 |
| 2016/0146864 | A1* | 5/2016 | Kobayashi | H04Q 9/00 702/57 |
| 2016/0337048 | A1* | 11/2016 | Hsueh | H04B 15/005 |

FOREIGN PATENT DOCUMENTS

| CN | 102341584 A | 6/2015 |
|---|---|---|
| DE | 10 2012 023 460 A1 | 6/2014 |

\* cited by examiner

DEVICE AND METHOD FOR RECOGNIZING DISRUPTIONS IN AN ON-BOARD POWER SUPPLY

CROSS REFERENCE TO RELATED APPLICATION

This application is based upon and claims the benefit of prior German Patent Application No. 10 2015 209 588.6, filed on May 26, 2015, the entire contents of which are incorporated herein by reference.

TECHNICAL FIELD

The present disclosure relates to a device for recognizing disruptions, in particular arcs, in an on-board power supply, as well as a corresponding method.

BACKGROUND

The number of power consumers in modern vehicles as well as the power consumption thereof continues to increase. That is why it is being considered to equip vehicles with a 48 V on-board power supply which is able to supply different consumers (loads) in the vehicle with a greater amount of power at steady current strengths. The use of 48 V leads to the problem, however, that where there is damage by a short circuit, stable arcs can form since 48 V is above the arc ignition voltage. However, the formation of stable arcs not only occurs in 48 V on-board power supplies in motor vehicles but rather in on-board power supplies in general which are operated at a voltage above the arc ignition voltage, such as, for example, in airplanes, ships or rail vehicles.

Traditionally, electrical wires in an on-board power supply are protected by safety fuses. However, since an arc acts as an additional resistor in the wire, the short-circuit current is restricted such that the fuse is not triggered.

In general, a distinction is made between two types of arcs, namely serial and parallel arcs, which will be explained in more detail below.

FIG. 1 shows an example of a parallel arc and in particular a switching arrangement in an on-board power supply with a 48 V voltage source and a current profile over time. Parallel arcs occur parallel to the load. These are caused, for example, by defective cable insulation such that a short circuit occurs to the body or the existing 12 V on-board power supply. With parallel arcs, the current strength has a succession of spikes that have several hundred amperes. Since the spikes can be short, however, the mean current is often not sufficient to trigger the fuse.

FIG. 2 shows an example of a serial arc and in particular a switching arrangement in an on-board power supply with a 48 V voltage source. Serial arcs occur in series to the load. These are caused, for example, by cable breakage or damage to plug-in connectors. Serial arcs act as an additional resistor in the electrical circuit such that the current strength is reduced in comparison to the intact state of the electrical circuit. Consequently, a serial arc restricts the load current such that a fuse is not triggered.

Both serial and parallel arcs generate very high temperatures such that a stable arc can cause serious damage to the vehicle. Consequently, it is desirable to recognize early on the emergence of an arc. It is very difficult, however, to distinguish the current restriction by a serial arc from fluctuations in the decrease in current by the load. In particular, protection of wires in a 48 V on-board power supply cannot be carried out via safety fuses since the current through the fuse is reduced by the arc effect such that the fuse is not triggered.

Recognizing disruptions (e.g. high-resistance short circuits) creates specific problems which occur, for example, during the slow chafing of the wire and/or electromigration. The short-circuit arc currents are hard to recognize here since they can be located in the load region. On the other hand, the arc power is not that high, and therefore recognition may require more time.

Known possibilities for detecting parallel and serial arcs are described below.

With parallel arcs, part of the current flows across an arc to the mass via a short circuit parallel to the load (see FIG. 1). The current $I_{in}$ fed into the wire is thus $I_{load}+I_{arc}$. The parallel short circuit with arcs can therefore be recognized by a differential current measurement. The current in the wire $I_{in}$ and the current to the load $I_{load}$ are measured. Without a parallel short circuit, $I_{load}=I_{in}$. In the case of the parallel short circuit, $I_{arc}=I_{in}-I_{load}$ can be calculated. Accordingly, the condition for recognition is $I_{in}-I_{load}>0$.

DE 10 2012 023 460 A1 describes such a method for recognizing a parallel arc in a motor vehicle on-board power supply. The motor vehicle on-board power supply comprises a component path in the network area, the component path having at least one electrical component. The motor vehicle on-board power supply has a first and a second current measuring unit in the component path to measure the current in each component path. The first current measuring unit measures the current at a first measuring point and the second current measuring unit at a second measuring point in the component path. To monitor the component path as to the emergence of arcs, the motor vehicle on-board power supply comprises at least one arc monitoring unit for recognizing an arc by a difference in current between the current measured in the first current measuring unit and the current measured in the second current measuring unit.

With serial arcs, an arc is formed in series to the load by an interruption in the electrical circuit (e.g. line breakage). Owing to the voltage drop across the arc, $U_{in}-U_{load}=I\times Z_{wire}+U_{arc}$ applies. Since the arc voltage with $U_{arc}$, typically above 15 V, is very high, the drop in voltage across the wire resistance $Z_{wire}$ is negligible in the first approximation and $U_{in}-U_{load}>15$ V applies as the condition for the recognition of a serial arc.

The parallel arc can thus be recognized by a differential current measurement at the beginning and the end of the wire and the serial arc can be recognized by a differential current measurement.

If the current and voltage measurement at the beginning of the wire occurs in a current distributor and the measurement of current and voltage at the end of the wire occurs in a load, communication of the measured signals to an evaluation unit must occur.

However, it is problematic with this approach that the measurements in the load and in the feeding current distributor occur independent of one another and the measurement values must first be communicated via a bus system. The measurement values are therefore asynchronous and delayed in relation to one another. Synchronization of the measurements and taking into account the time delay are technically very complex. Even without arcs, the current distributor can detect a peak value during its cyclical sampling, whereas at the load it can detect a somewhat delayed, precisely a local minimum. The simple differential formation would thus generate a pseudo error. This applies in particular when high-resistance short circuits with currents in the load range are supposed to be recognized.

FIG. 3 shows an example of a system in which measurement values are asynchronous and delayed in relation to one another. The system comprises a load which is supplied with power from a battery via a supply line. The current from a current distributor is distributed thereby to different loads. The load is an intelligent load, i.e. the load comprises an electronic circuit which measures the voltage and current strength on the load. The measured values are sent by means of a serial interface to the current distributor via a communication channel.

The current distributor comprises a reception unit which receives the measurement values sent by the load and relays them to an evaluation unit. The current distributor is further configured to measure the current flowing through the current distributor and the voltage applied to the current distributor. These measurement values are also detected by the evaluation unit. Based on the measurement values received, the evaluation unit recognizes the occurrence of an arc.

FIG. 4 shows the problem of the asynchronous and delayed arrival via the communication channel of the data in the evaluation unit. The upper part of FIG. 4 shows the temporal profile of a measured quantity, such as, for example, the current strength at the current distributor and the load without an arc.

The central part of FIG. 4 shows the measuring point in time (tsv) in the current distributor. The current distributor measures every 10 ms.

The lower part of FIG. 4 shows the measuring point in time (tL) in the load. The load measures every 8 ms, thus the sampling intervals differentiate between the current distributor and the load. Additionally, the current distributor and the load do not start their measurements simultaneously but instead offset by 2 ms. Thus, the measurements do not occur synchronously.

Furthermore, there are time delays owing to the communication channel such that the measurement values are not simultaneously present in the current distributor. It is assumed in FIG. 4 that the communication channel leads to a delay of 20 ms. The current distributor performs a determination of an arc every 5 ms based on the difference of the present measurement values. In the current distributor the measurement value tsv0 is found in the 0-4 ms interval and the measurement value tsv10 is found in the 10-14 ms interval. The values tsv20 and tL2 are found in the 20-24 ms interval, the values tsv30 and tL10 are found in the 30-34 ms interval, the value tL18 is found in the 35-19 ms interval, the values tsv40 and tL26 are found in the 40-44 ms interval and the values tsv50 and tL34 are found in the 50-55 ms interval. If the measurement values within an interval have a difference larger than a threshold value, the evaluation unit determines the presence of an arc. However, this determination can be erroneous owing to the asynchronicity and the time delay if the measured quantity varies greatly.

SUMMARY

The present disclosure is based on the object of providing a simple and reliable device for recognizing disruptions in an on-board power supply.

This object is solved by a device having the features of claim 1 and a method having the features of claim 11. Advantageous embodiments are described in the subclaims.

According to an embodiment, a device for recognizing disruptions in an on-board power supply comprises a reception unit adapted to receive a first and a second temporal sequence of measurement values, the measurement values of the first sequence being measured at a first measuring point of the on-board power supply and the measurement values of the second sequence being measured at a second measuring point of the on-board power supply differing from the first measuring point, and the measurement values representing current or voltage values, and comprises an evaluation unit adapted to recognize the occurrence of a disruption based on a comparison of a first dispersion of the measurement values of the first sequence and of a second dispersion of the measurement values of the second sequence.

By using the dispersion of the measurement values, the recognition of a disruption can be performed with an independent, asynchronous and time-delayed measurement. In particular, the measurements at the two measuring points do not have to be synchronized. Additionally, by using the dispersion of the measurement values, an error tolerance is achieved by system-related invariance with regard to measurement errors (offset errors in the measurement, proportional errors). The present disclosure thus uses stochastic methods for recognizing current and voltage differences which indicate a disruption.

Additionally, the present disclosure uses the current and voltage measurements that are already available (but not synchronized) at different points of the on-board power supply. By this, additional, new, fast and expensive synchronous bus systems can be avoided for the synchronous differential measurement. Furthermore, there is a tolerance for imprecisions (measurement errors) of the current/voltage measurement.

According to an advantageous embodiment, the evaluation unit recognizes the occurrence of a disruption when the first dispersion differs by a predetermined percentage from the second dispersion.

This percentage can be selected such that the recognition time of the disruption is so small that there is a switching off before, for example, 1 kJ is consumed by the disruption.

According to a further advantageous embodiment, the evaluation unit recognizes the occurrence of a parallel arc as a disruption if the measurement values represent current values and the occurrence of a serial arc as the disruption when the measurement values represent voltage values.

Thus, the device can be used both for the differential current and differential voltage analyses and as a consequence can recognize parallel and serial arcs.

According to a further advantageous embodiment, the reception unit receives new measurement values for the first sequence and/or the second sequence, and the evaluation unit calculates the first dispersion and/or the second dispersion each by means of an exponential smoothing when the reception unit receives new measurement values. In other words, the evaluation unit calculates the first dispersion and/or the second dispersion each by means of an exponential smoothing in a moving time window.

As a consequence, the device consecutively calculates new values for the dispersion. This enables an online evaluation of the measurement values or of the error current recognition/voltage drop recognition.

According to a further advantageous embodiment, the device also comprises a first measurement unit which is adapted to measure the measurement values of the first sequence and to send the measured measurement values to the reception unit.

The device thus detects the measurement values of the first sequence and receives the measurement values of the second sequence.

According to a further advantageous embodiment, the device further comprises a second measurement unit which is adapted to measure the measurement values of the second sequence and to send the measured measurement values to the reception unit.

According to a further advantageous embodiment, a first measurement value which is measured at a first point in time at the first measuring point and a second measurement value which is measured at a second measuring point differing from the first point in time are assigned the same time points by the reception unit in the first sequence and in the second sequence. In other words, these measurement values of the two measuring points are each simultaneously used for the intended purpose of dispersion across a moving time window and thus the continuous dispersion is ascertained in a time window for the first measuring point and the continuous dispersion is ascertained in a time window for the second measuring point.

Accordingly, the device can recognize disruptions from asynchronous and delayed measurements. Thus, it is not necessary to synchronize the two measurements.

According to a further advantageous embodiment, if the measurement values represent current values, the evaluation unit can still recognize the occurrence of a disruption if at least one of the measurement values in the first or the second sequence exceeds a predetermined threshold value.

This additional functionality makes it possible to quickly recognize the occurrence of a disruption before the current becomes so great that it damages the on-board power supply. In particular the current peaks with parallel arcs (see FIG. 1) can be reliably recognized in this manner.

According to a further advantageous embodiment, the on-board power supply comprises a current distributor, a load and an electrical wire connecting the current distributor and the load, and the first measuring point is located on a connecting part of the current distributor with the electrical wire and/or the second measuring point is located on a connecting part of the load with the electrical wire.

Consequently, a disruption can be recognized in an electrical wire between the current distributor and the load.

In order to reduce the data transmission within the device according to a further advantageous embodiment of the present disclosure, a decentralized pre-processing of the measurement values is provided. For example, processing occurs of the measurement values into data representing the dispersion of the measurement values prior to transmission of these data via a communication bus. This can occur for one or even both measuring points. If the pre-processing of the measurement values of a measuring point occurs already in the evaluation unit by the local proximity of the measuring point and evaluation unit, only the data of the other measuring point must be decentrally pre-processed and transmitted via a communication bus (e.g. serial bus interface as in FIG. 3).

According to one embodiment, a method for recognizing disruptions in an on-board power supply comprises the steps of: Receiving a first and a second temporal sequence of measurement values, the measurement values of the first sequence being measured at a first measuring point of the on-board power supply and the measurement values of the second sequence being measured at a second measuring point of the on-board power supply differing from the first measuring point, and the measurement values representing current values or voltage values, and recognizing the occurrence of a disruption based on a comparison (recognizing a deviation) of a first dispersion of the measurement values of the first sequence and of a second dispersion of the measurement values of the second sequence.

BRIEF DESCRIPTION OF THE DRAWINGS

The present disclosure will be described in detail below with the aid of the enclosed drawings.

DETAILED DESCRIPTION

Embodiments of the present disclosure will be described in detail below with reference to the accompanying drawings. Similar or corresponding elements in the different drawings will each be designated with the same or similar reference numbers.

Embodiments of the present disclosure which will be described in detail below will be described in detail with reference to a device for recognizing disruptions in an on-board power supply. However, it is noted that the following description only contains examples and should not be seen as a description restricting the present disclosure.

Figure 5:
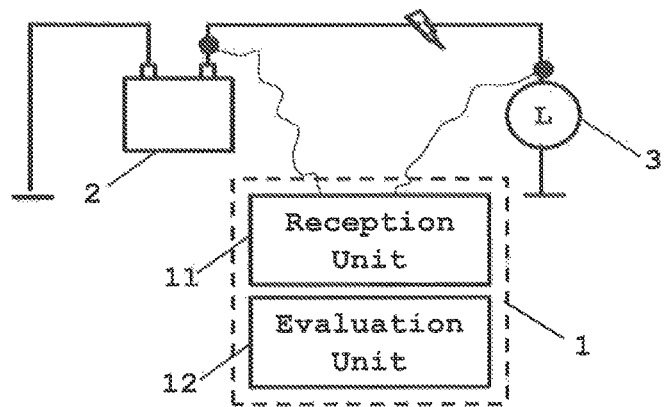
FIG. 5 schematically shows a device for recognizing disruptions in an on-board power supply according to an embodiment of the present disclosure.

FIG. 5 schematically shows a device 1 that comprises a reception unit 11 and an evaluation unit 12. An electrical wire connects inter alia a power source 2 with a load 3. Furthermore, the electrical wire connects the load 3 with the mass. The disruption is, for example, a serial or a parallel arc on the electrical wire. The disruption can be in particular a high-resistance short circuit, as occurs, for example, during slow chafing of the electrical wire and/or electromigration. The electrical wire can be a part of an on-board power supply between the load 3 and the voltage source 2 or the mass. The on-board power supply can be part of a motor vehicle, airplane, ship or rail vehicle. For example, the device 1 can be arranged in and/or on the distributor or in and/or on the load.

The reception unit 11 is adapted to receive a first and a second temporal sequence of measurement values. The measurement values of the first sequence are measured at a first measuring point of the on-board power supply. The measurement values of the second sequence are measured at a second measuring point of the on-board power supply differing from the first measuring point. The measurement values can represent current values or voltage values. If current values are measured, parallel arcs can be recognized as a disruption. If voltage values are measured, serial arcs can be recognized as a disruption.

The measurement can take place at the points connecting the electrical wire with the load 3 and with the voltage source 2, respectively. FIG. 5 shows in an exemplary manner that the voltage is measured at a connecting part of the electrical wire with the voltage source and is measured at a connecting part of the electrical wire with the load.

The evaluation unit 12 is adapted to recognize the occurrence of a disruption based on a comparison of a first dispersion of the measurement values of the first sequence and of a second dispersion of the measurement values of the second sequence.

The dispersion can be in particular the expected value of the deviation from the mean value (standard deviation). However, the dispersion is not limited thereto and can also be, for example, the variation, spread, the mean absolute deviation, the mean absolute deviation with regard to the median, the median of the absolute deviations, the variation coefficient or the (inter)quartile range.

The evaluation unit 12 recognizes disruptions such as, for example, arcs, i.e. self-perpetuating gas discharges between two electrodes, since this causes a significant deviation of the two dispersions. In general, however, not only arcs but also any disruptions can be recognized (such as, for example, high-resistance short circuits) which lead to a substantial deviation of the dispersions of the measurement values (e.g. more than 150%).

Device 1 can further control a switch. When the evaluation unit 12 recognizes the occurrence of a disruption, it opens the switch to separate the voltage source 2 from the load 3. The switch is advantageously a semiconductor switch, e.g. a power semiconductor switch such as a power MOSFET (metal-oxide-semiconductor field-effect transistor) which is controllable with minimal delay. The device can comprise the switch.

Below an embodiment of the present disclosure will be explained using a parallel arc as the disruption in a motor vehicle with a 48 V on-board power supply.

Figure 1:
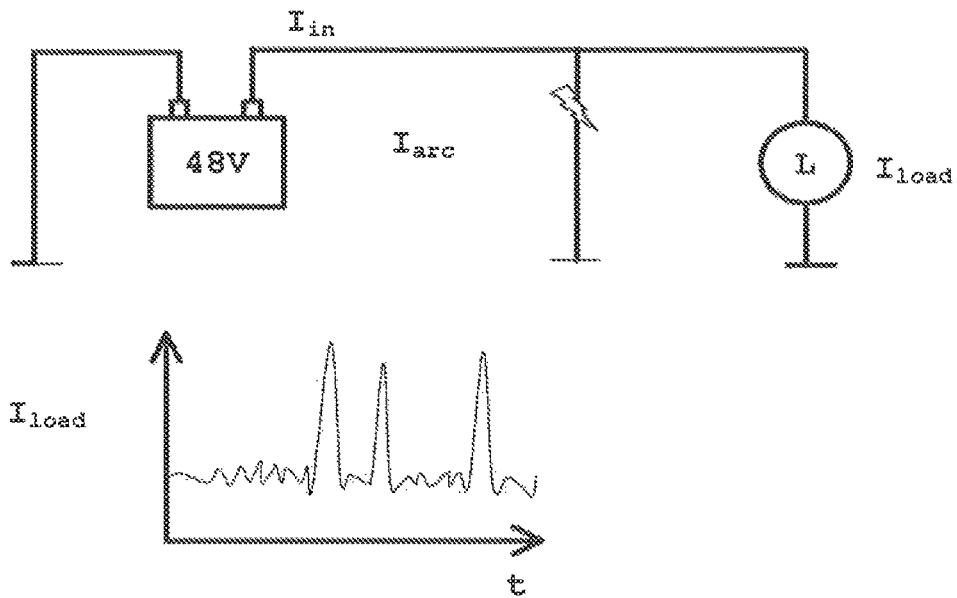
FIG. 1 schematically shows a parallel arc and the temporal profile of the current strength occurring thereby.
Figure 6:
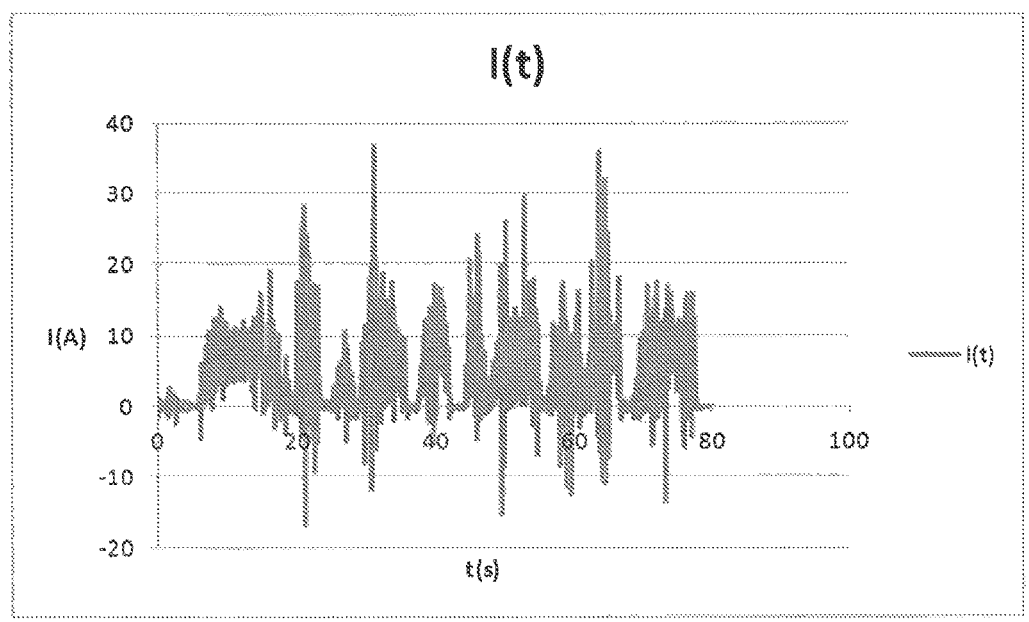
FIG. 6 shows a typical load current $I_{load}$ of a dynamic chassis function in a motor vehicle with a 48 V on-board power supply.

In FIG. 6 the load current $I_{load}$ is shown over time. If there is not a parallel short circuit, the current $I_{in}$ at the end of the wire (towards the load) is equal to the current in the feeding distributor ($I_{load}=I_{in}$, cf. FIG. 1). FIG. 6 considers a typical load current of a dynamic chassis function (which is used in 48 V).

Figure 7:
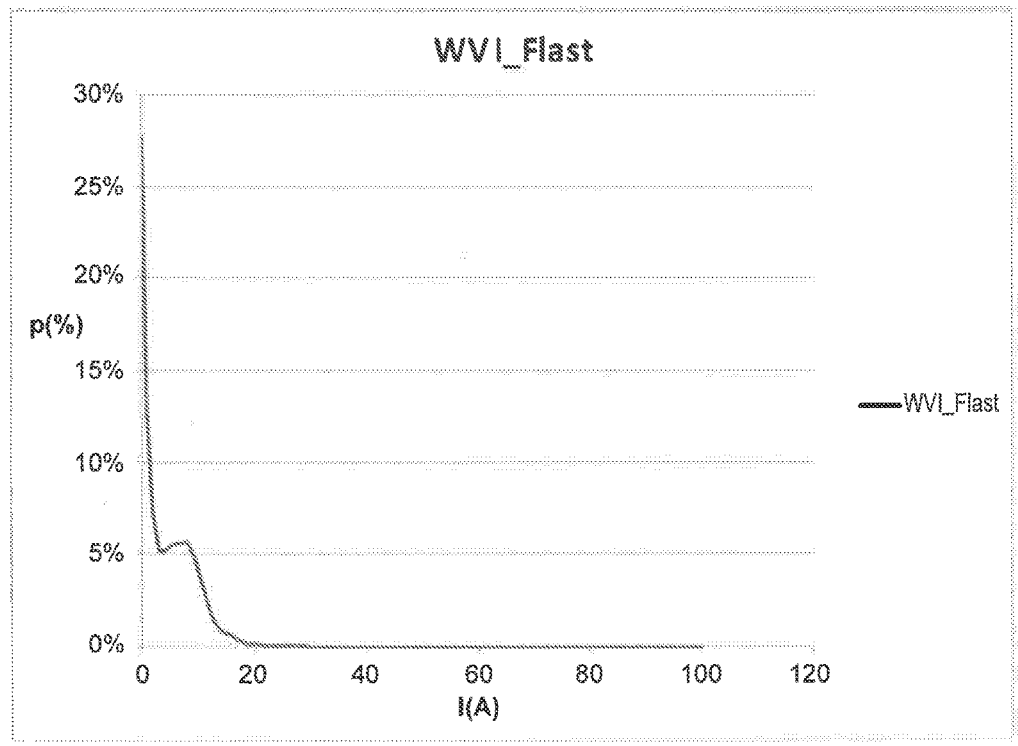
FIG. 7 shows the frequency distribution $p(I(A))$ of the load current in FIG. 6.

FIG. 7 shows the probability distribution/frequency distribution p(I(A)) of the load current $I_{load}$ in FIG. 6 during a sampling of 10 ms with a sampling every 10 ms with the starting value 0 s. During a sampling of 10 ms and with the starting value 5 ms (asynchronous, phase shift 180°), virtually the same image results. The individual measurement values do show differences throughout, however the probability distribution remains the same as long as the observation period is substantially greater than the time between two sampling values (sampling rate) and greater than the time delay between the measurements (here: 1 s>>10 ms). As long as a parallel arc is not present, the probability distributions in the distributor and in the load will be very similar (nearly identical).

Figure 8:
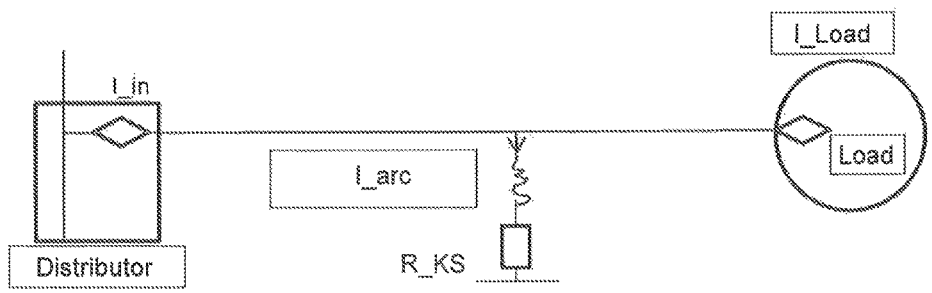
FIG. 8 schematically shows an on-board power supply with a parallel arc.

FIG. 8 schematically shows an on-board power supply with a parallel arc. The input current is now equal to $I_{in}=I_{arc}+I_{load}$.

Figure 9:
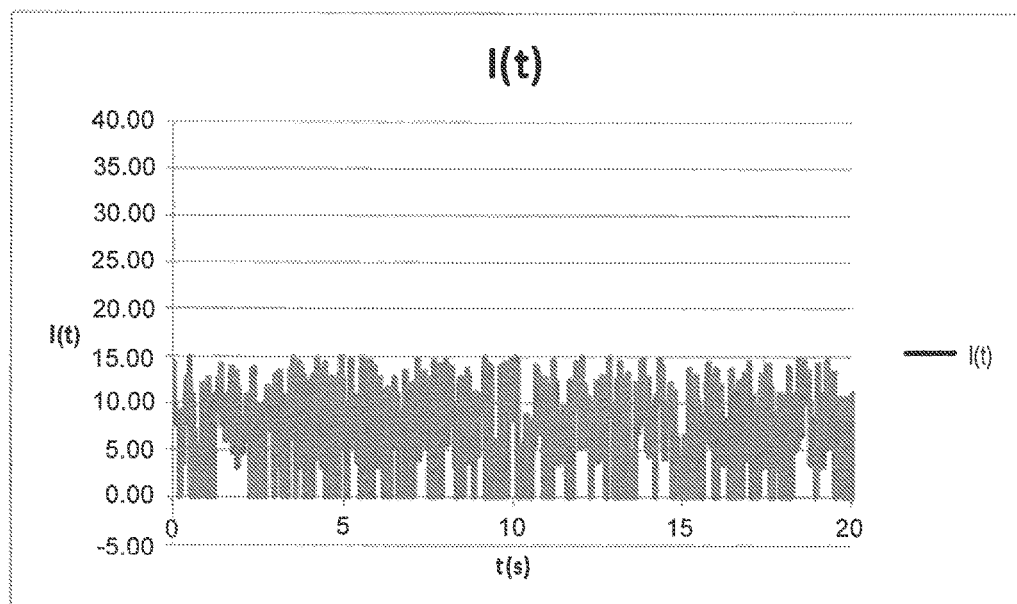
FIG. 9 shows a current profile of $I_{arc}$ with a parallel arc.

FIG. 9 shows a current profile of $I_{arc}$ with a parallel arc with comparatively higher-resistance linkage ($R_{KS}$ in the range of 3 Ohm). The arc currents that occur are clearly within the normal load range of the load (cf. FIG. 6) and thus cannot be recognized by simple threshold value formation. This arc current adds to the load current from FIG. 6. Arc measurements have shown that the arc current represents an intermittent, stochastic variable.

Figure 10:
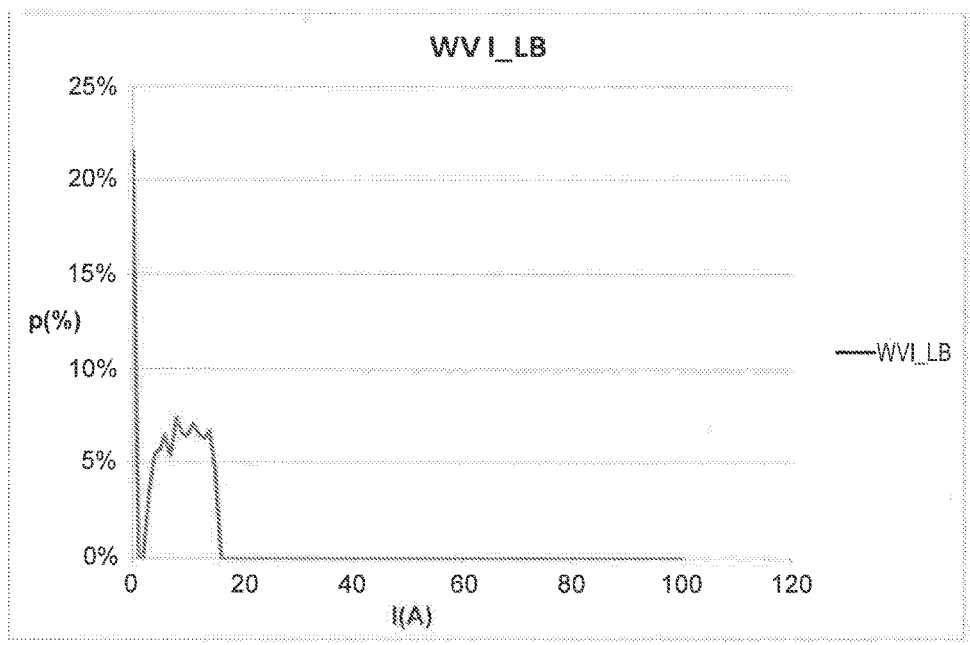
FIG. 10 shows the frequency distribution of the arc current $I_{arc}$.

FIG. 10 shows the frequency distribution of the arc current p ($I_{arc}$). Since the arc current adds to the load current, the following applies for the current from the distributor:

$$I_{in}=I_{load}+I_{arc}.$$

For the probability distribution p of $I_{in}$, the following applies (since these are two independent random variables):

$$p_{in}(I_{in})=\Sigma p_{load}(I) \times p_{arc}(I_{in}-I)$$

This is the discrete variation of the convolution integral and reveals that the probability distribution of the arc current is reflected about the y-axis, shifted across the probability distribution of the load current and multiplied (convoluted).

Figure 11:
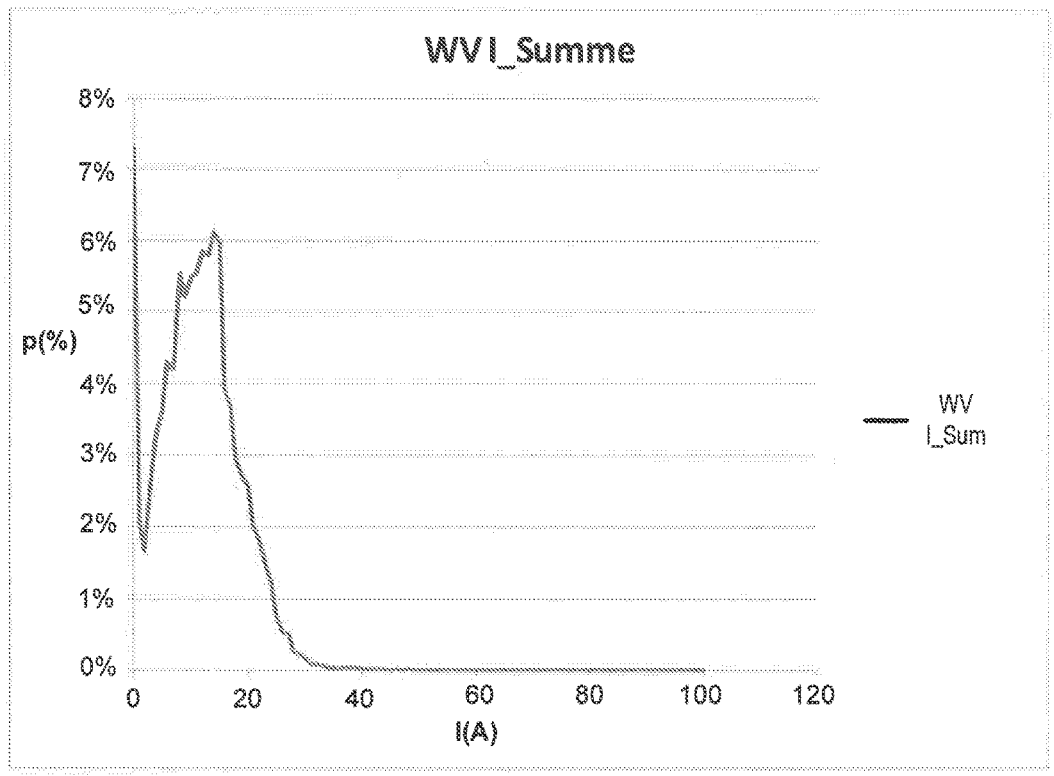
FIG. 11 shows the frequency distribution of the sum current $I_{in}=I_{arc}+I_{load}$.

The result of the convolution sum is the probability distribution $p_{in}(I)$ of the input current from the current distributor, as is shown in FIG. 11.

For example, the current and/or voltage measurement at the beginning of the wire takes place in the current distributor and the measurement of current and/or voltage at the end of the wire takes place in an intelligent load. The intelligent loads have, for example, their own μC and sensor resources which can be advantageously used to measure the current and the voltage. The communication to the feeding current distributor can occur via existing bus systems such as Lin or CAN, or both via a gateway.

Figure 12:
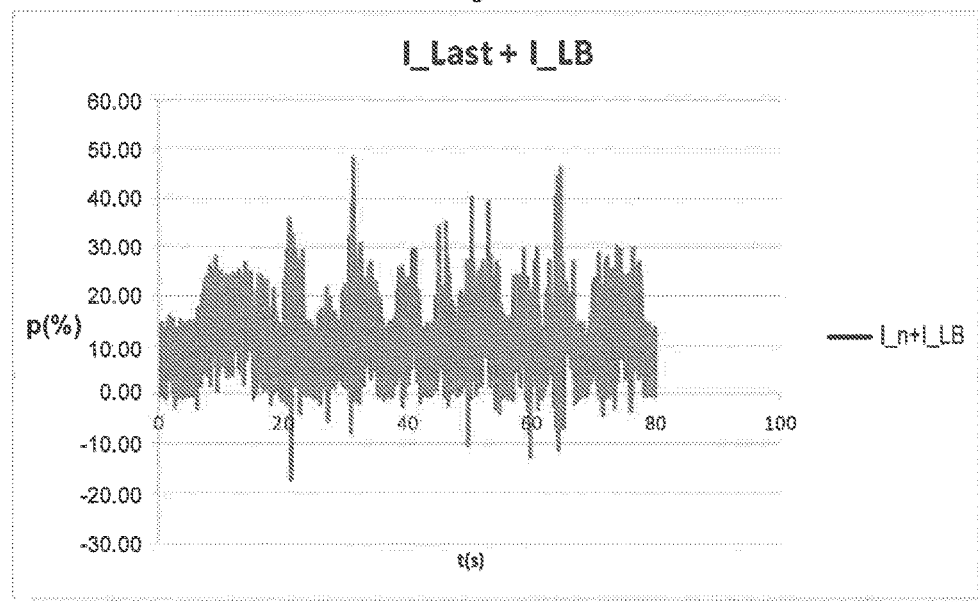
FIG. 12 shows the sum current $I_{in}=I_{load}+I_{arc}$ in the time range.

FIG. 12 shows the sum current $I_{in}=I_{load}+I_{arc}$ in the time range. Although the comparison with the load current (FIG. 6) of the graph in the time range does not look very different, a considerable difference does result for the probability distribution (compare FIG. 10 to FIG. 11).

By the addition of the two random variables, a new probability distribution results, the width thereof corresponding to the sum of the width of the individual probability distributions. The width of the probability distribution is designated as a dispersion of the random variable (here load current and arc current). The dispersion is the expected value of the deviation from the mean value. In accordance with the stochastic regularities, the effect results that the (large) dispersion of the arc current adds to the dispersion of the load current.

The increase in the dispersion of the input current 6 in comparison to the dispersion of the load current $I_{last}$ is thus a good criterion for the presence of an arc. This applies in particular since constant disruption variables or disruption variables which only change comparably slowly, such as offset errors in the measurement, do not have any dispersion or only very low dispersion. The stochastic signal evaluation is thus nearly invariable with regard to quasi-constant measurement errors.

Figure 13:
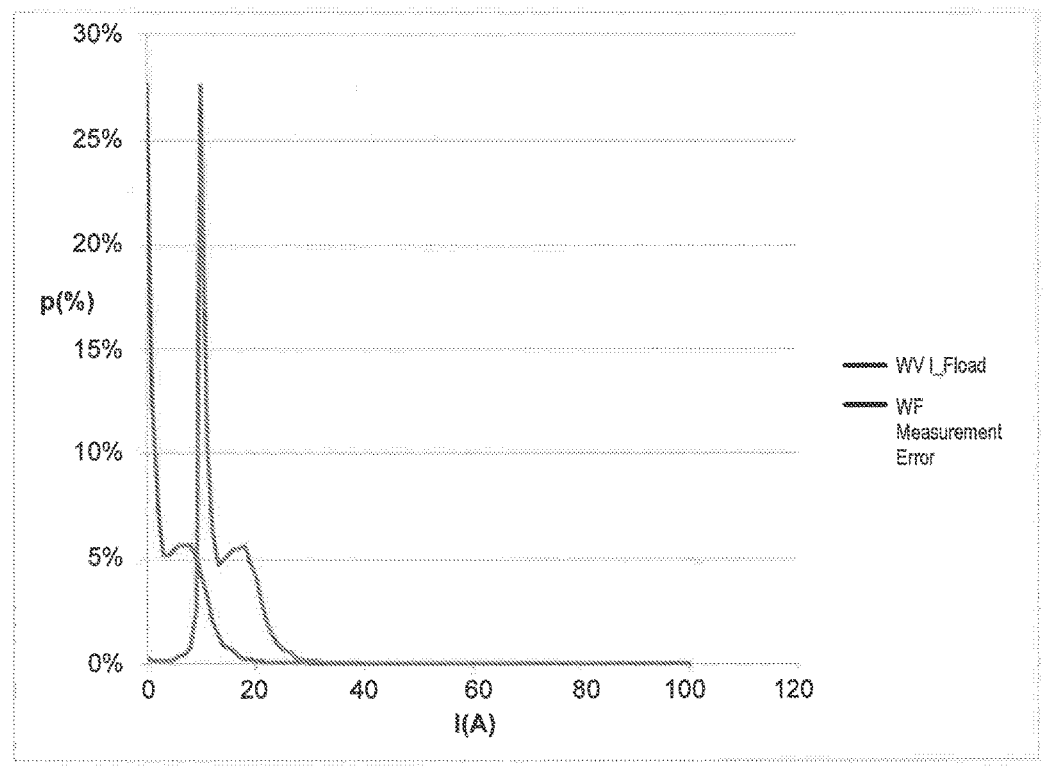
FIG. 13 shows the displacement of a probability distribution owing to a constant measurement error.

FIG. 13 shows the shift of a probability distribution owing to a constant measurement error of 10 A. The dispersion, as an expected value of the deviation from the mean value, remains the same.

Below an algorithm will be described for the flowing "online" ascertainment of the dispersion.

The continuous mean value is ascertained via an exponential filter (exponential smoothing):

$$MWI_{in}(n) = MWI_{in}(n-1) - MWI_{in}(n-1)/Z + I_{in}(n)/Z \quad (1)$$

$$MWI_{load}(n) = MWI_{load}(n-1) - MWI_{load}(n-1)/Z + I_{load}(n)/Z \quad (2)$$

Formulas (1) and (2) show the numerical calculation of the flowing, exponential mean value MWI both for the current into the wire (Iin) and to the load (Iload). Z designates the length of the filter. If Z=128 and the current value is sampled every 10 ms on the timeline represented by n (discrete time), the length of the filter is 1.28 s.

Below the current deviation from the mean value will be calculated.

$$\Delta IMWI_{in}(n) = ABS[MWI_{in}(n) - I_{in}(n)] \quad (3)$$

$$\Delta IMWI_{load}(n) = ABS[MWI_{load}(n) - I_{load}(n)] \quad (4)$$

ABS designates the absolute value. The dispersion SA is the expected a value of the deviation from the mean value. Therefore, averaging must be performed again in the time window to obtain the value of the dispersion:

$$SAI_{in}(n) = SAI_{in}(n-1) - SAI_{in}(n-1)/Z + \Delta IMWI_{in}(n)/Z \quad (5)$$

$$SAI_{load}(n) = SAI_{load}(n-1) - SAI_{load}(n-1)/Z + \Delta IMWI_{load}(n)/Z \quad (6)$$

Equations (5) and (6) thus designate the dispersion as an expected value of the deviation from the mean value in a flowing filter window of the width Z samples, i.e.

$$t_f = Z \times t_{sample} \text{ (e.g. } t_f = 128 \times 10 \text{ ms} = 1.28 \text{ s)}.$$

The condition below can be introduced as a criterion for the presence of an error current (or of an error voltage difference):

$$SAI_{in}(n) > x(\%) \times SAI_{load}(n),$$

when $SAI_{in}(n) > Y(A)$ \quad (7)

If x % is set, for example, to 150%, the presence of an arc is recognized if the dispersion of the input current $I_{in}$ into the wire is more than 1.5 times as large as the dispersion of the load current $I_{load}$ in a moving window of $t_f$ seconds. Y (A) can be 2 A, for example, so that small noise quantities do not violate the proportionality criterion.

Figure 2:
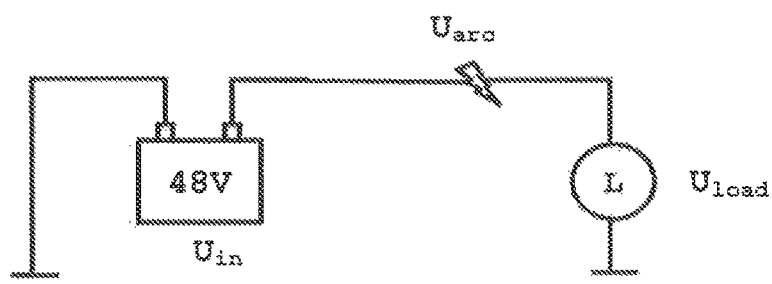
FIG. 2 schematically shows the occurrence of a serial arc.
Figure 3:
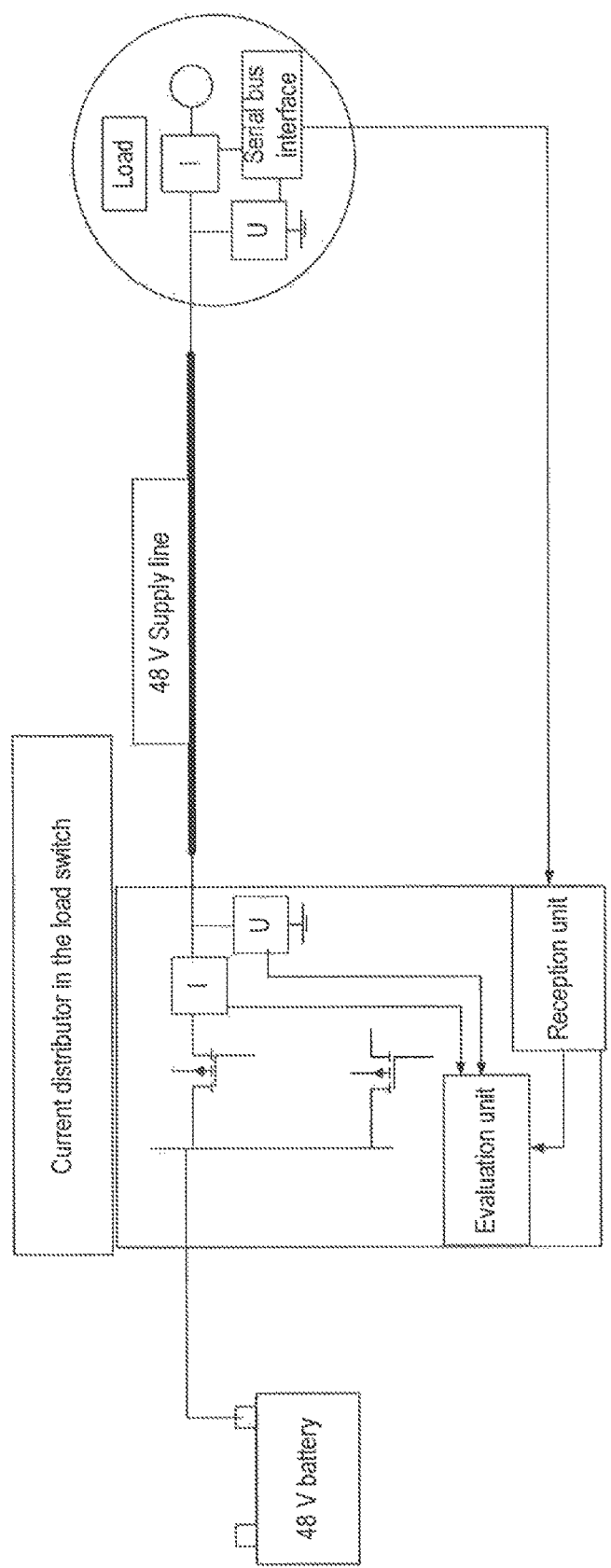
FIG. 3 shows an example of a system in which measurement values are asynchronous and delayed in relation to one another.
Figure 4:
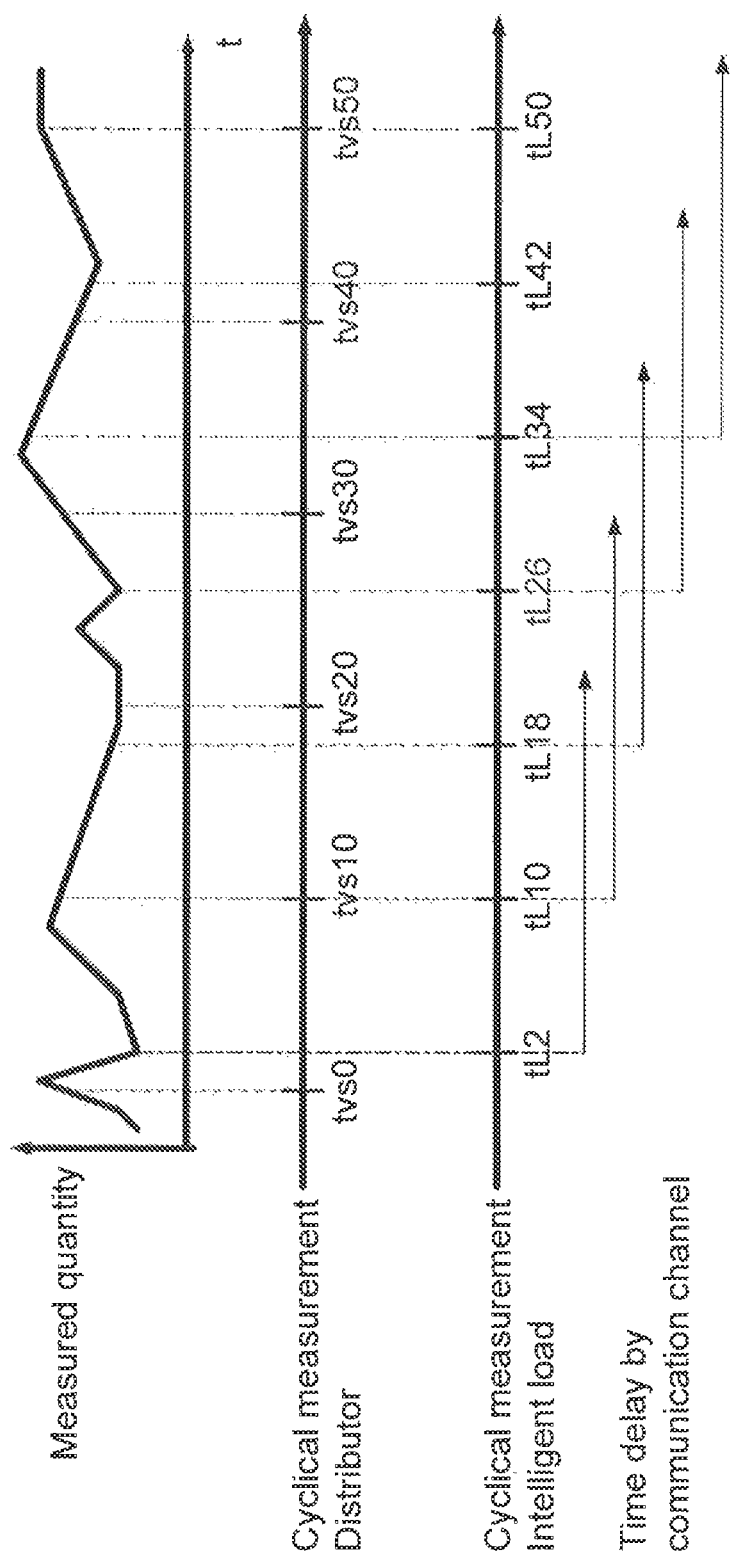
FIG. 4 shows the problem of the asynchronous and delayed arrival of data via the communication channel in the current distributor.

Formulas (1) to (7) also apply to the differential voltage measurement if $I_{load}$ is replaced by $U_{load}$ and is replaced by $U_{in}$ (cf. FIG. 2).

Below an embodiment of the present disclosure will be described, in which the calculation of the dispersion is applied by means of an exponential filter.

The following parameters are set:

The load current $I_{load}$ is sampled every 10 ms, both in the current distributor 2 during the feeding into the wire and in the load 2.

The measurements occur asynchronously and are shifted in relation to one another by 5 ms (180°).

The delay between the signals is 100 ms.

The window width of the filter is 1.28 s.

Figure 15:
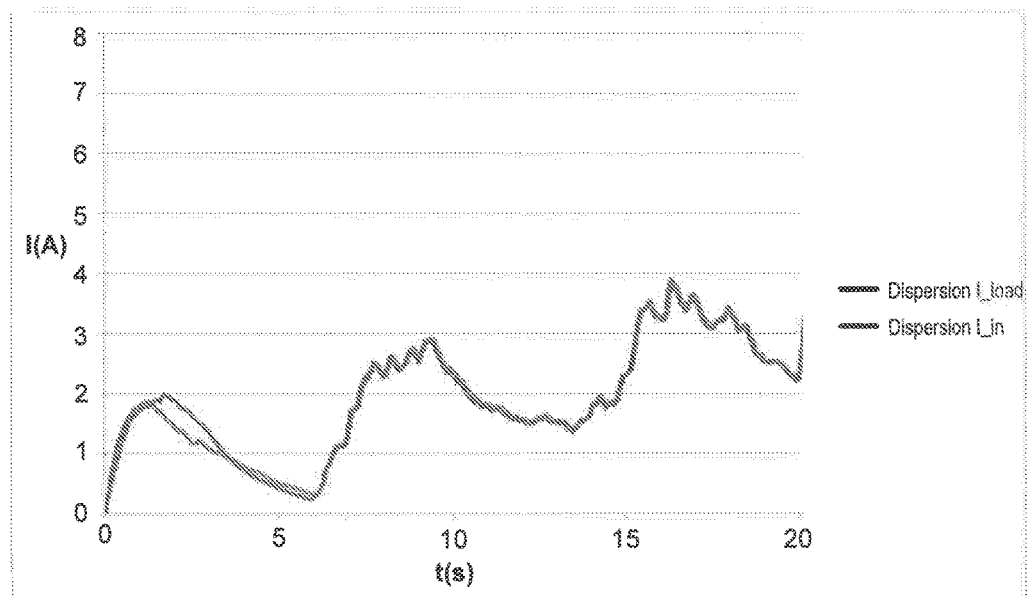
FIG. 15 shows the dispersion of $I_{in}$ and $I_{load}$ if a parallel arc is not present and if there is a measurement error of 5 A for $I_{in}$.

Measurement errors due to offset: 5 A (in FIG. 15).

Figure 14:
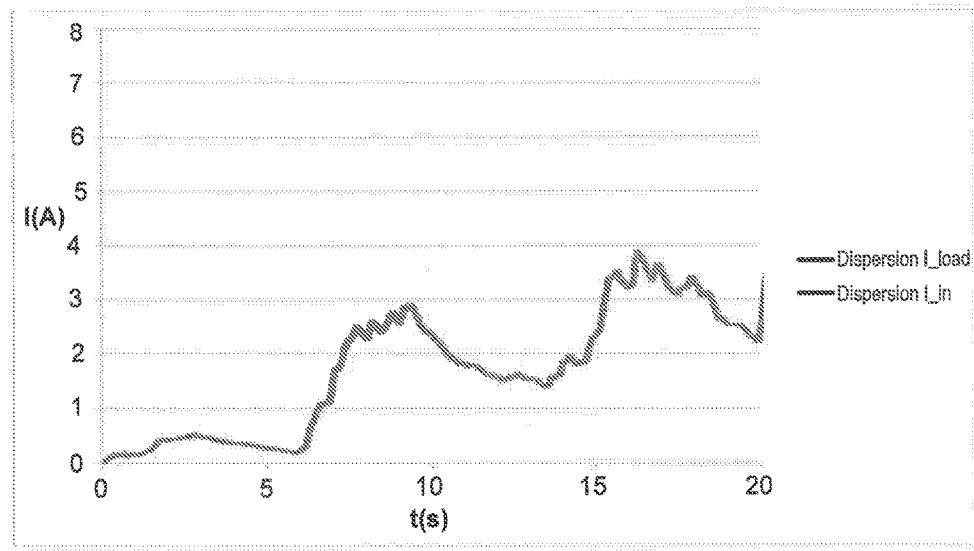
FIG. 14 shows the dispersion of $I_{in}$ and $I_{load}$ if a parallel arc is not present.

FIG. 14 shows the dispersion of $I_{in}$ and $I_{load}$ when an error current is not present (no parallel arc). The determination of the dispersion in the feeding distributor ($I_{in}$) and in the load ($I_{load}$) across the moving 1.28 s window essentially show the same values. FIG. 12 shows that the two graphs for the dispersion are superimposed with a small deviation, although it is sampled offset by $t_{sample}/2$ and with a time delay of 50 ms.

FIG. 15 shows the dispersion of $I_{in}$ and $I_{load}$ when a measurement error of 5 A is present for $I_{in}$ (but without an arc). The initial deviation in FIG. 14 comes from the "boundary value problem" and only occurs at the beginning of the measurement due to the different initial situation of the filter. If the filter is given sufficient time for "phasing", the error no longer occurs.

Figure 16:
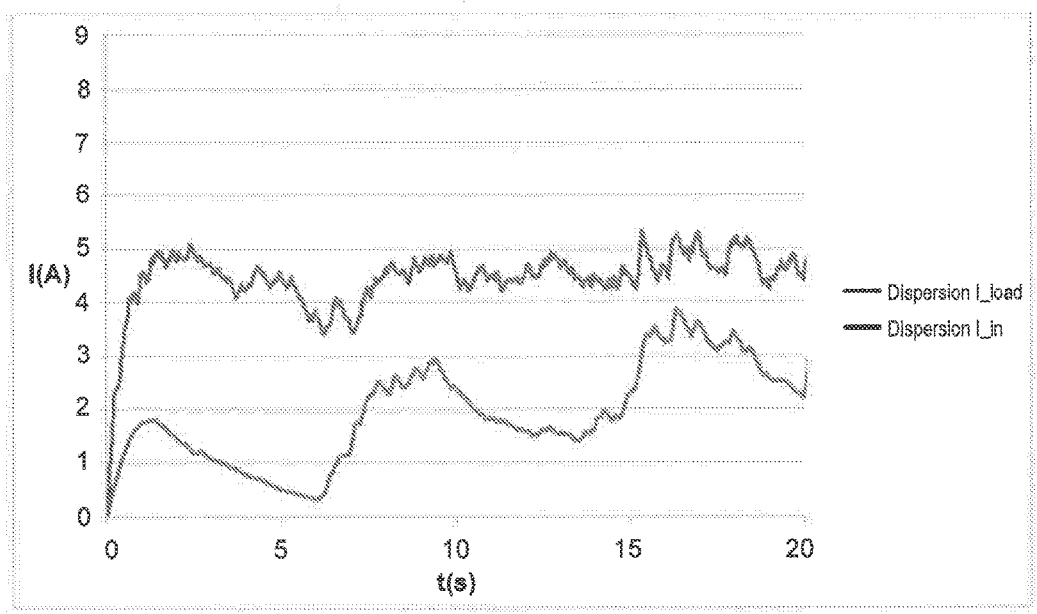
FIG. 16 shows the dispersion of $I_{in}$ and $I_{load}$ if there is an error current (parallel arc according to FIG. 7).

FIG. 16 shows the dispersion of $I_{in}$ and $I_{load}$ when there is an error current (parallel arc according to FIG. 7) already at 0 s. FIG. 14 shows that the addition of the error current such that it leads to a considerable deviation of the dispersions leads to sufficient criterion for the presence of the error current. In FIG. 16, the upper curve is the dispersion of $I_{in}$ and the lower curve is the dispersion of $I_{load}$.

Figure 17:
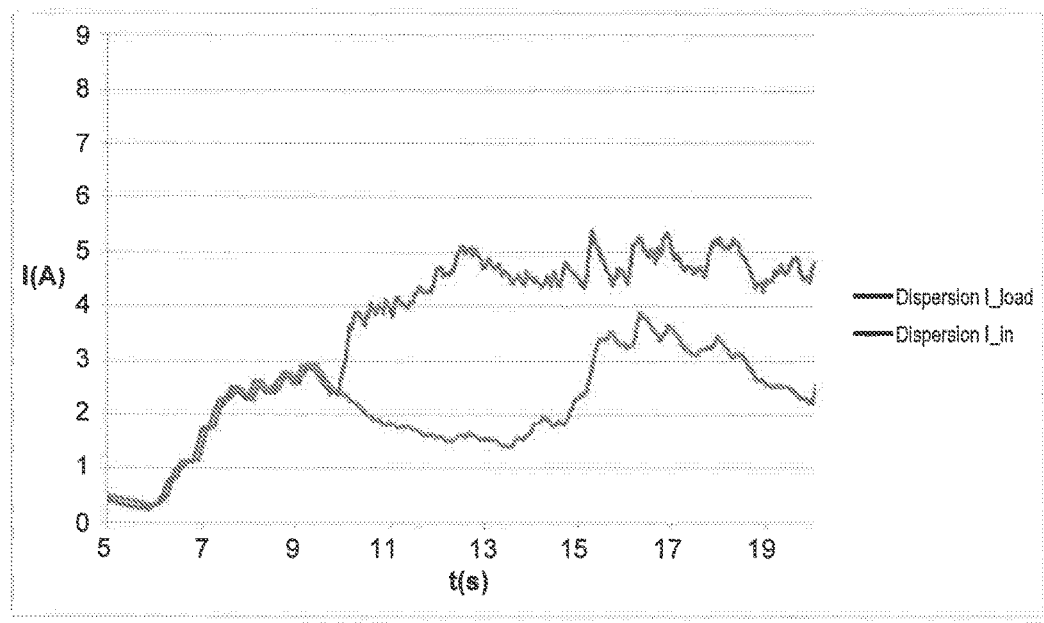
FIG. 17 shows the dispersion of $I_{in}$ and $I_{last}$ when an error current occurs after 10 s.

FIG. 17 shows the dispersion of $I_{in}$ and $I_{load}$ when an error current occurs after 10 s such that the dispersions strongly diverge. In FIG. 17 the upper curve is the dispersion of $I_{in}$ and the lower curve is the dispersion of $I_{load}$.

Figure 18:
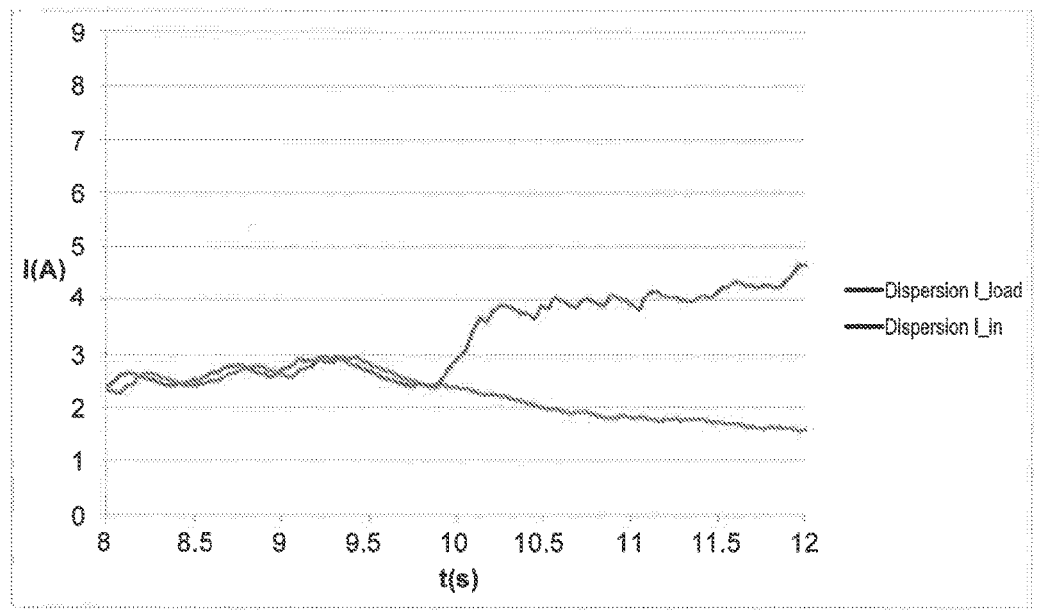
FIG. 18 shows a temporal zoom of FIG. 15.

FIG. 18 shows a temporal zoom of FIG. 17. The criterion for arc recognition is achieved after 0.5 s. In FIG. 18 the upper curve is the dispersion of $I_{in}$ and the lower curve is the dispersion of $I_{load}$.

Figure 19:
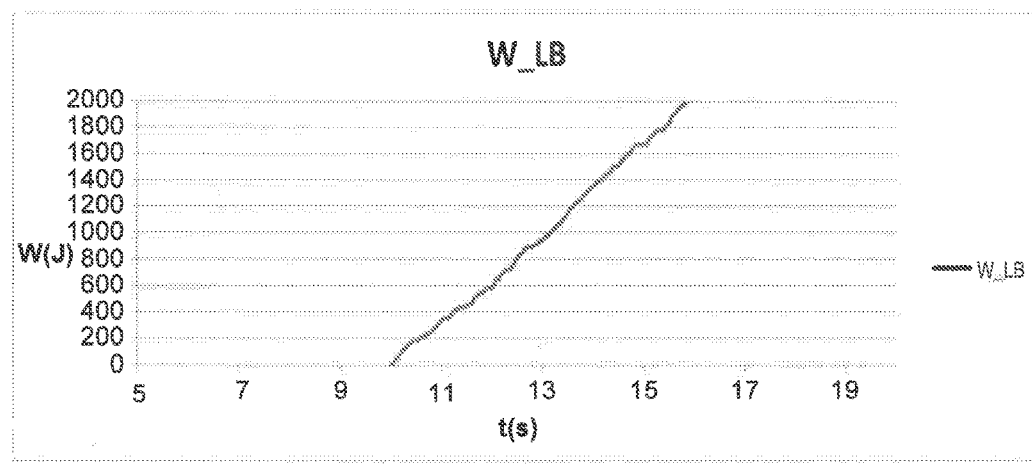
FIG. 19 shows the energy consumed in the arc with a profile according to FIG. 17.

FIG. 19 shows the energy consumed in the arc with a profile according to FIG. 17. FIG. 19 shows that, when the error current is used after 10 s and recognized within 10.5 to 11 s and switched off, the arc energy $W_{LB}$ remains below 400 Ws. The switch-off thus occurs quickly enough.

Figure 20:
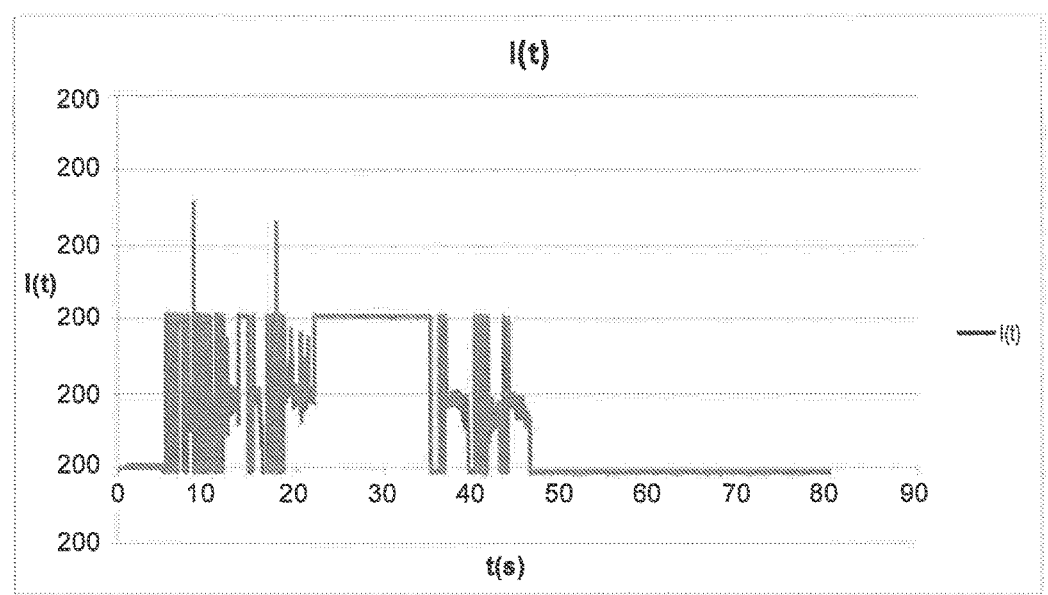
FIG. 20 shows a specific measurement of a parallel arc.
Figure 21:
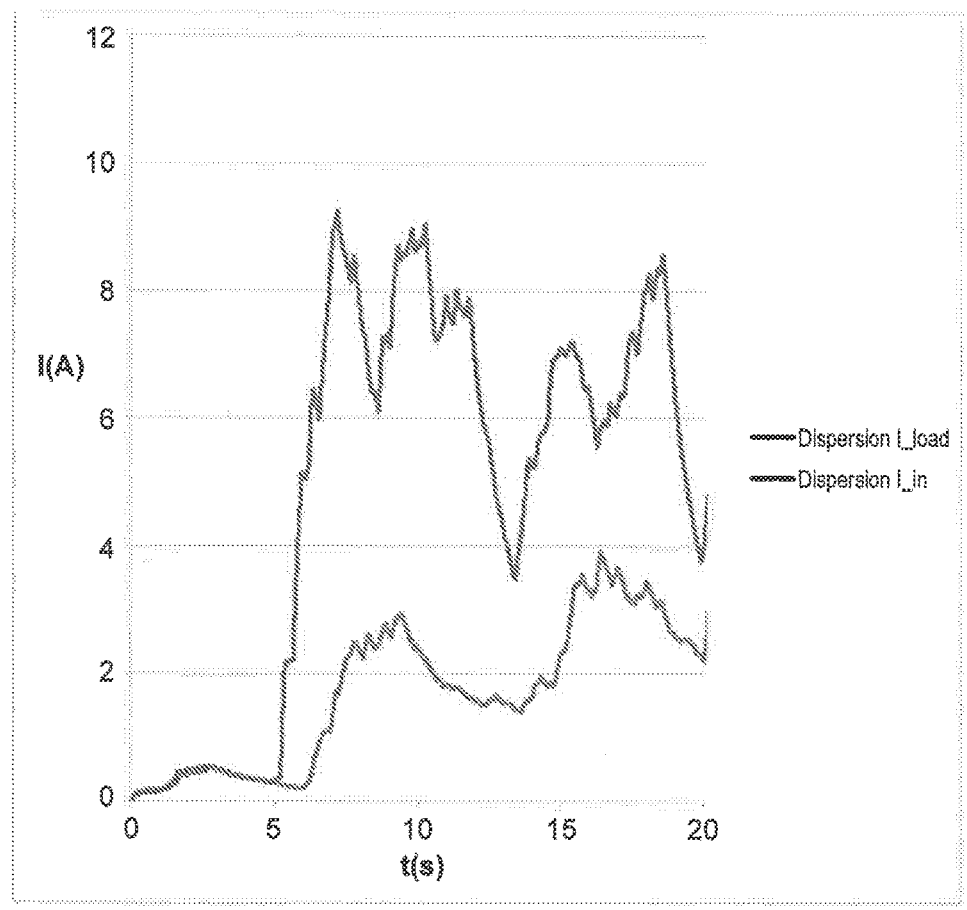
FIG. 21 shows the filter output for the measurement in FIG. 20.

FIG. 20 and FIG. 21 show a simulation based on specific error current measurements. FIG. 20 shows a specific measurement of a serial arc. FIG. 21 shows the filter output for an asynchronous measurement with 100 ms delay and 180° phase shift. The effect on the dispersion is very noticeable. In FIG. 21 the upper curve is the dispersion of $I_{in}$ and the lower curve is the dispersion of $I_{load}$.

Figure 22:
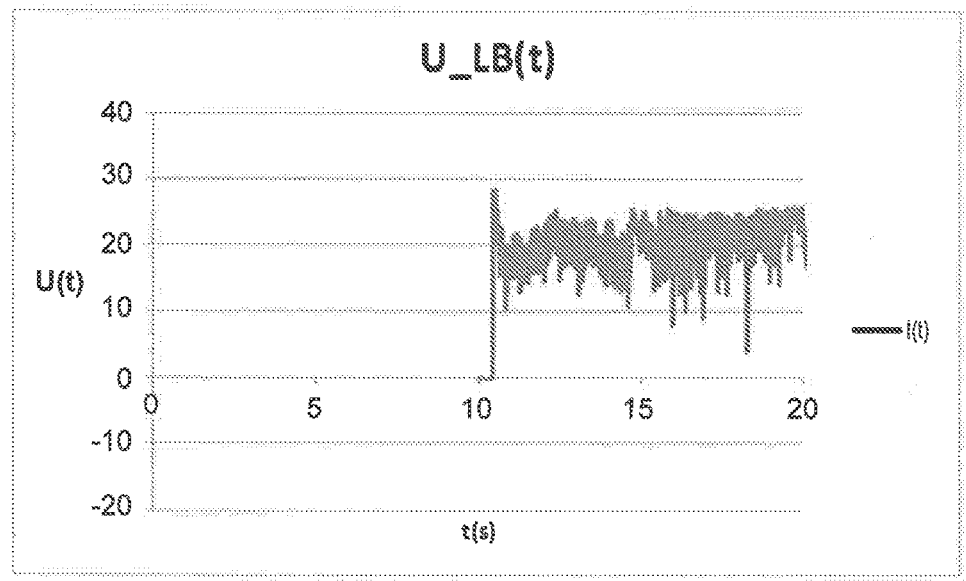
FIG. 22 shows the arc voltage $U_{arc}$ of a serial arc.
Figure 23:
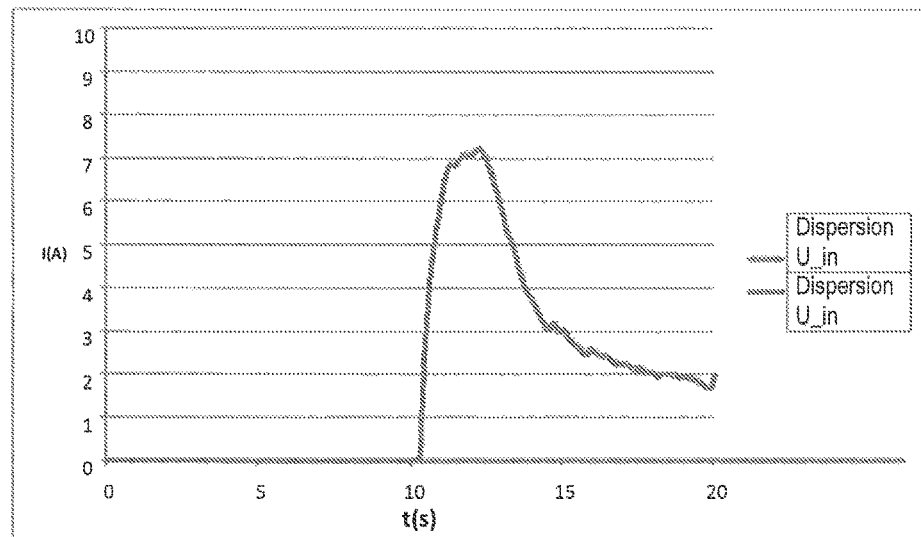
FIG. 23 shows the filter output variables of a differential voltage measurement.

FIG. 22 and FIG. 23 show a further embodiment of the present disclosure, in which the voltage values are measured such that a serial arc can be recognized. FIG. 22 shows the arc voltage $U_{arc}$ of the serial short circuit. Therefore, at the load 48 V minus this arc voltage is measured. FIG. 23 shows the filter output variables of the differential voltage measurement. In FIG. 23 the upper curve is the dispersion of $U_{load}$ and the lower curve is the dispersion of $U_{in}$. While the input voltage has almost no dispersion (the voltage of the distributor is as constant as possible), the voltage at the load has a large dispersion owing to the arc voltage.

Figure 24:
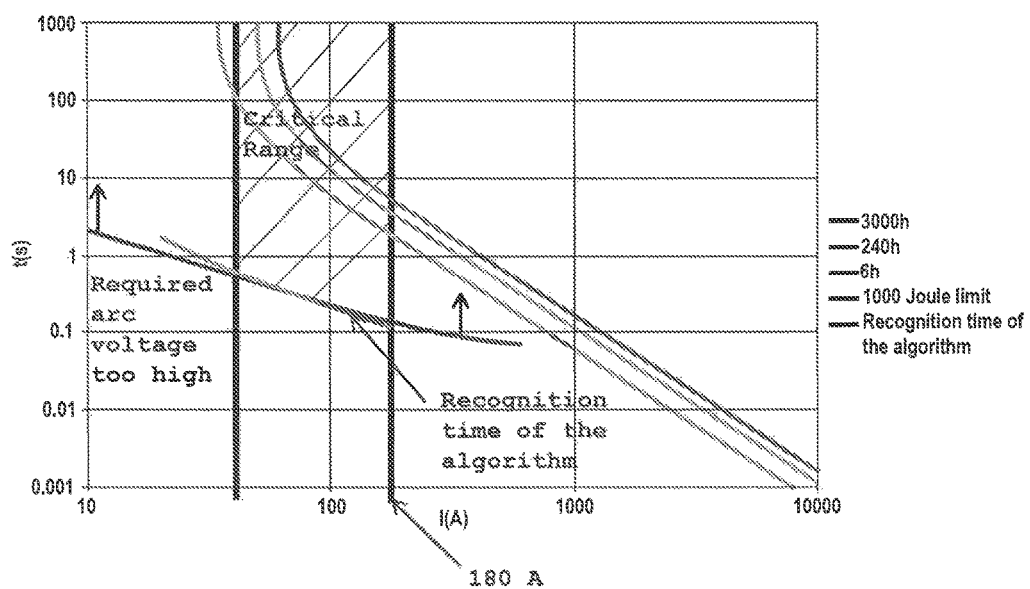
FIG. 24 shows the working range of an embodiment of the present disclosure.

FIG. 24 shows the working range of an embodiment of the present disclosure. FIG. 24 shows a double logarithmic representation of a characteristic I(t) of an electrical circuit. A threshold value switch-off of the electrical circuit is performed when the current strength exceeds 180 A. This serves inter alia to protect the semiconductor used since this cannot tolerate and switch between any size of currents. A 1 kJ line is plotted for the energy consumed in an arc, which is not to be exceeded during operation. This results from the correlation $t=1000 \text{ J}/(48 \text{ V}\times\text{I}+\text{Ri}\times\text{I}^2)$ where Ri=40 mOhm. With short times and small currents the formation of arcs does not occur since the necessary arc voltage (46 V) is too high.

However, a "critical range" results in which a switch-off of the threshold value does not yet take place but more than 1 kJ is consumed in the arc. This "critical range" is covered, however, by the present disclosure since this lies within the recognition time according to the abovementioned algorithm.

According to the abovementioned embodiments, the following effects can thus be achieved:

Recognition of error current by arc with independent, asynchronous and time-delayed measurement at the beginning and end of the wire.

In the simulation
sampling every 10 ms with 180° phase shift
time delay 100 ms

Error tolerance by systemic invariance regarding measurement errors: offset errors in the measurement, proportional errors.

Online evaluation of the error current recognition/voltage drop recognition: 1.24 s moving time window.

Recognition time is so short that it is turned off before 1 kJ is consumed in the arc.

Short circuits in the load range (weak short circuits) are recognized.

The method works for both the differential current analysis and the differential voltage analysis.

As is understood by the skilled person, reception unit, the evaluation unit and measurement unit may include a bus, a processing unit, a main memory, a ROM, a storage device, an I/O interface consisting of an input device and an output device, and a communication interface, such as a transceiver. The bus may include a path that permits communication among the components. Processing unit may include a processor, a microprocessor, or processing logic that may interpret and execute instructions. Main memory may include a RAM or another type of dynamic storage device that may store information and software instructions for execution by processing unit.

The reception unit, the evaluation unit and measurement unit may perform certain operations or processes described herein. The reception unit, the evaluation unit and measurement unit may perform these operations in response to processing unit executing software instructions contained in a computer-readable medium. A computer-readable medium may be defined as a physical or a logical memory device. For example, a logical memory device may include memory space within a single physical memory device or distributed across multiple physical memory devices.

The software instructions contained in a main memory may cause the processing unit including a processor, when executed on the processor, to cause the processor to perform operations or processes described herein. Alternatively, hardwired circuitry may be used in place of or in combination with software instructions to implement processes and/or operations described herein. Thus, implementations described herein are not limited to any specific combination of hardware and software.

The physical entities according to the different embodiments of the present disclosure, including the elements, units and systems, may comprise or store computer programs including software instructions such that, when the computer programs are executed on the physical entities, steps and operations according to the embodiments of the present disclosure are carried out, i.e. cause processing means to carry out the operations. In particular, embodiments of the present disclosure also relate to computer programs for carrying out the operations/steps according to the embodiments of the present disclosure, and to any computer-readable medium storing the computer programs for carrying out the above-mentioned methods.

Where the terms reception unit, the evaluation unit and measurement unit are used, no restriction is made regarding how distributed these elements may be and regarding how gathered these elements may be. That is, the constituent elements may be distributed in different software and hardware components or other elements for bringing about the intended function. A plurality of distinct elements may also be gathered for providing the intended functionalities.

Further, the elements of reception unit, the evaluation unit and measurement unit may be implemented in hardware, software, Field Programmable Gate Arrays (FPGAs), Application Specific Integrated Circuits (ASICs), firmware or the like.

It will be apparent to those skilled in the art that various modifications and variations can be made in the entities and methods of the present disclosure as well as in the construction of the present disclosure without departing from the scope or spirit of the present disclosure.

The present disclosure has been described in relation to particular embodiments and examples which are intended in all aspects to be illustrative rather than restrictive. Those skilled in the art will appreciate that many different combinations of hardware, software and/or firmware will be suitable for practicing the present disclosure.

What is claimed is:

1. A device for evaluating electrical disruptions in an on-board power supply of a vehicle, comprising:
a reception unit configured to receive a first and a second temporal sequence of electrical measurement values, wherein the measurement values of the first sequence reflect measured values obtained from a first measuring point of the on-board power supply and the measurement values of the second sequence reflect measured values obtained from a second measuring point of the on-board power supply differing from the first measuring point, and the measurement values represent current or voltage values along a line of the on-board power supply of the vehicle;
a switch configured to selectively couple a voltage source of the on-board power supply to a load of the on-board power supply; and
an evaluation unit configured to determine an electrical disruption occurrence based on a comparison of at least a first standard deviation of the electrical measurement values of the first sequence and at least a second standard deviation of the electrical measurement values of the second sequence, wherein the evaluation unit is configured to control the switch in order to separate the voltage source from the load when the evaluation unit determines the electrical disruption occurrence.

2. The device according to claim 1, wherein the evaluation unit is configured to determine the occurrence of an electrical disruption when at least the first standard deviation differs by a predetermined percentage from at least the second standard deviation.

3. The device according to claim 1, wherein the evaluation unit is configured to:
  determine the occurrence of a parallel arc as the disruption when the measurement values represent current values; and
  determine the occurrence of a serial arc as the disruption when the measurement values represent voltage values.

4. The device according to claim 1, wherein the reception unit is configured to receive new measurement values for at least one of the first sequence or the second sequence; and the evaluation unit is configured to calculate at least one of the first standard deviation or the second standard deviation, each in a moving time window.

5. The device according to claim 1, further comprising:
  a first measurement unit configured to measure the measurement values of the first sequence and transmit the measured measurement values to the reception unit.

6. The device according to claim 5, further comprising:
  a second measurement unit configured to measure the measurement values of the second sequence and to transmit the measured measurement values to the reception unit.

7. The device according to claim 1, wherein a first measurement value reflects a measured value obtained at a first point in time at the first measuring point and a second measurement value reflects a measured value obtained at a second point in time, asynchronous to the first point in time, at the second measuring point, and the measurement values of the two measuring points are each simultaneously used to calculate the standard deviations across moving time windows, and at least a first continuous standard deviation is ascertained in a time window for the first measuring point and at least a second continuous standard deviation is ascertained in a time window for the second measuring point.

8. The device according to claim 1, wherein, when the measurement values represent current values, the evaluation unit is further configured to determine the occurrence of a disruption if at least one of the measurement values in the first or the second sequence exceeds a predetermined threshold value.

9. The device according to claim 1, wherein:
  the on-board power supply includes a current distributor and an electrical wire connecting the current distributor and the load; and
  the first measuring point is located on a connecting part of the current distributor with the electrical wire or the second measuring point is located on a connecting part of the load with the electrical wire.

10. The device according to claim 1, wherein processing the measurement values into data representing the standard deviation of the measurement values occurs prior to a transmission of the data via a communication bus.

11. A method for evaluating electrical disruptions in an on-board power supply of a vehicle, comprising the following steps:
  receiving a first and a second temporal sequence of electrical measurement values, wherein the measurement values of the first sequence reflect measured values obtained from a first measuring point of the on-board power supply and the measurement values of the second sequence reflect measured values obtained from a second measuring point of the on-board power supply differing from the first measuring point, and the measurement values represent current or voltage values along a line of the on-board power supply of the vehicle;
  determining an electrical disruption occurrence based on the recognition of a deviation from at least a first standard deviation of the electrical measurement values of the first sequence and at least a second standard deviation of the electrical measurement values of the second sequence; and
  controlling a switch to separate a voltage source of the on-board power supply from a load of the on-board power supply when the electrical disruption occurrence is determined.

12. A tangible, non-transitory computer-readable medium storing instructions that, when executed by at least one processor, cause the at least one processor to perform operations comprising:
  receiving a first and a second temporal sequence of electrical measurement values, wherein the measurement values of the first sequence reflect measured values obtained from a first measuring point of the on-board power supply and the measurement values of the second sequence reflect measured values obtained from a second measuring point of the on-board power supply differing from the first measuring point, and the measurement values represent current or voltage values along a line of the on-board power supply of the vehicle;
  determining an electrical disruption occurrence based on the recognition of a deviation from at least a first standard deviation of the electrical measurement values of the first sequence and at least a second standard deviation of the electrical measurement values of the second sequence; and
  controlling a switch to separate a voltage source of the on-board power supply from a load of the on-board power supply when the electrical disruption occurrence is determined.

* * * * *